(12) United States Patent
Gruber et al.

(10) Patent No.: US 6,910,615 B2
(45) Date of Patent: Jun. 28, 2005

(54) SOLDER REFLOW TYPE ELECTRICAL APPARATUS PACKAGING HAVING INTEGRATED CIRCUIT AND DISCRETE COMPONENTS

(75) Inventors: Peter A. Gruber, Mohegan Lake, NY (US); Minkailu A Jalloh, Poughkeepsie, NY (US); Chon Cheong Lei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 10/400,944

(22) Filed: Mar. 27, 2003

(65) Prior Publication Data

US 2004/0188497 A1 Sep. 30, 2004

(51) Int. Cl.$^7$ .......................... B23K 31/02; B23K 37/00
(52) U.S. Cl. .......................... 228/103; 228/8; 228/119; 228/207; 228/215
(58) Field of Search ................................. 228/119, 191, 228/264, 49.5, 41, 43, 207, 215, 103, 8

(56) References Cited

U.S. PATENT DOCUMENTS 5,560,531 A * 10/1996 Ruszowski ................... 228/19
5,695,109 A * 12/1997 Chiang et al. ................ 228/33
5,788,143 A * 8/1998 Boyd et al. .................. 228/253
6,062,460 A * 5/2000 Sato ........................... 228/119

* cited by examiner

Primary Examiner—Kiley S. Stoner
(74) Attorney, Agent, or Firm—Thomas A. Beck; Daniel P. Morris

(57) ABSTRACT

In a solder reflow type building of modular electrical apparatus involving integrated circuit and discrete components, fabrication operations are arranged to include the providing of a general type series of steps for each component element involving a reflow or joining step at the highest joining temperature, immediately followed by a solder flux cleaning step and immediately followed by a testing of the entire module constructed thus far. There is provided a further specific type operation for each different type of component element that includes the providing of a loop for the introduction of a replacement for any broken discrete component with joining being achieved with use of a lower fusion temperature solder, flux cleaning and testing at each joining followed by reinsertion into the module. There is further provided an operation at the encapsulation stage of the module building for introducing underfill between the component and supporting carrier.

11 Claims, 3 Drawing Sheets

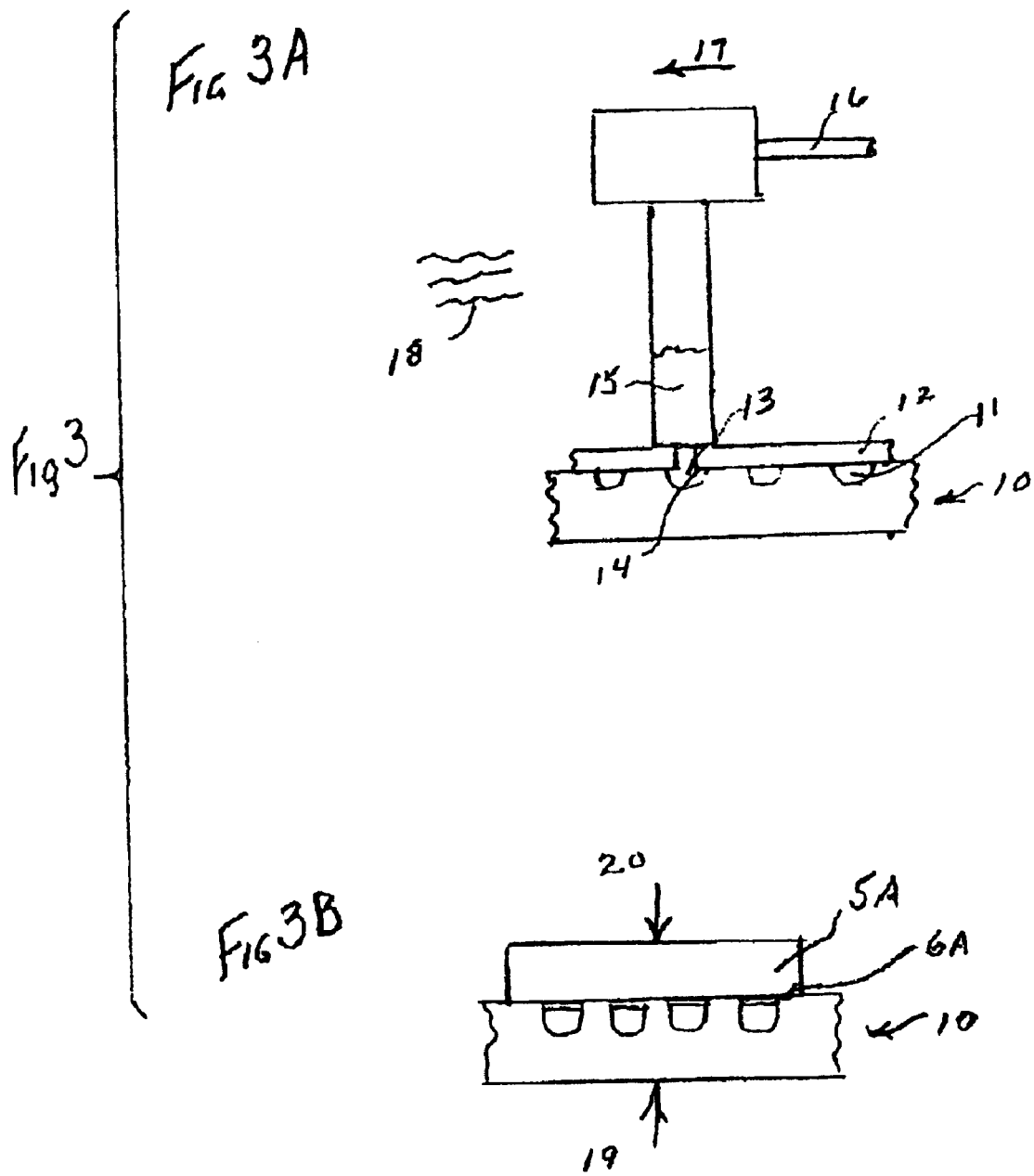

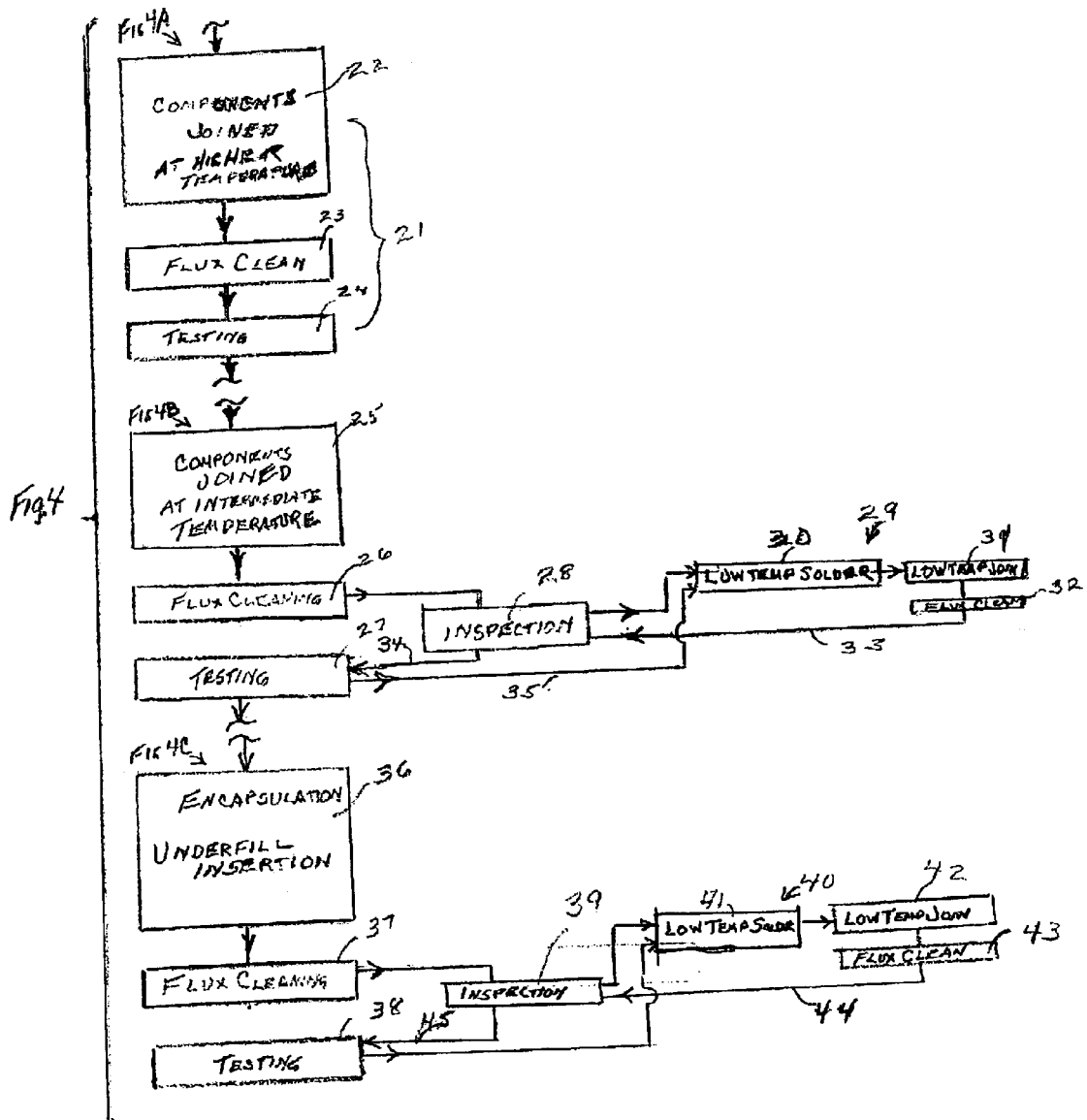

SOLDER REFLOW TYPE ELECTRICAL APPARATUS PACKAGING HAVING INTEGRATED CIRCUIT AND DISCRETE COMPONENTS

FIELD OF THE INVENTION

The invention is directed to the building of electrical apparatus in modular increments involving, in a solder reflow type connection procedure, both integrated circuit elements that for example may be of silicon or plastic encapsulated materials as component elements and discrete component elements on a carrier element that may be for example of a ceramic material. In particular the invention is directed, within a solder reflow type overall construction procedure, to the handling of component elements and situations that require unique processing, and to situations involving discrete component elements that have been identified as being defective and are to be replaced with a new discrete component element followed by being placed back into the overall fabrication procedure using new and lower temperature processing.

BACKGROUND

In the assembly of electrical apparatus the packaging is generally built as modular arrangements in levels, with testing at every stage. At the first level of packaging, there are usually one or more flexible function components such as integrated circuit component elements that for example may be made of semiconductor materials such as silicon or of plastic encapsulated materials, each of which require different processing considerations, and are interconnected in an overall solder reflow fabrication procedure with other functional components such as discrete capacitor elements in a modular configuration, all positioned on a common carrier member of a material such as ceramic that serves as a supporting substrate.

In such an arrangement, difficult processing balances may occur that have to be addressed and compensated for in the overall solder reflow fabrication procedure.

One such balance results from the need to accommodate the temperature requirements of the discrete components, the plastic encapsulated integrated circuit component elements and the silicon integrated circuit components in the overall fabrication procedure.

Another such balance is needed when there is breakage or even a discontinuity of a discrete component element and a repair type operation has to take place to replace the component with a new one, and to permit the testing of the overall structure during the continuing of the building of the modular structure.

SUMMARY OF THE INVENTION

In a solder reflow type modular building of electrical apparatus the fabrication operations in accordance with the invention are arranged to include the providing of a general type operation for each component element involving a reflow or joining step immediately followed by a solder flux cleaning step both in turn immediately followed by a testing of the entire apparatus constructed thus far, the providing of a specific type operation for each different type of entire apparatus component element in the being constructed module arranged in a descending solder temperature order, the providing of a two stage repair loop for the introduction of a replacement for any broken discrete component element in which, in each stage a lower fusion temperature solder is used in attaching a replacement discrete component each with testing of the entire apparatus constructed thus far, and,the providing of an operation at the encapsulation stage of the building apparatus for positioning of underfill between the component elements and the supporting carrier placement and testing of the entire module.

BRIEF DESCRIPTION OF THE DRAWINGS

FIG. 3 is a perspective depiction of the use of an example injection molding solder technology (IMS) in preparing a replacement discrete component element in which:

FIG. 3A is a side depiction of the injection apparatus filling interconnet voids in a mold sheet and;

FIG. 3B is a cross sectional side depiction of the joining of the filled voids to pads on discrete elements.

FIG. 4A is an example flow diagram of the steps that would be involved in accordance with the invention in component element selective solder joining, flux cleaning and testing in an increment of an overall modular construction.

FIG. 4B is an example flow diagram of the steps that would be involved in accordance with the invention in providing a repair loop with low temperature fusion solder for introduction of a replacement discrete element for one found to have been broken or missing.

FIG. 4C is an example flow diagram of the steps that would be involved in accordance with the invention in providing at the encapsulation of the apparatus an underfill for the integrated circuit component elements.

DESCRIPTION OF THE INVENTION

Figure 1:
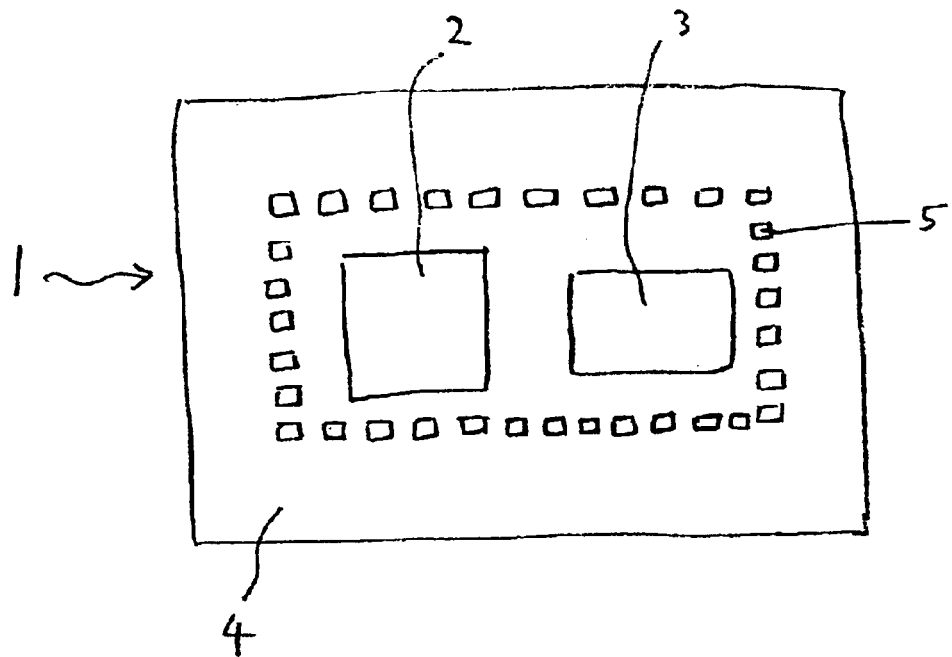
FIG. 1 is a top view of a depiction of a first level packaging arrangement of integrated circuit components positioned on a substrate of a material such as ceramic and surrounded by discrete components.

As the modular fabrication art progresses it is becoming advantageous to be able to include in a modular package items with somewhat complex connecting considerations. Discrete components, more than a single type of integrated circuit and the introduction of underfilling for structural reinforcement are examples.

The capacitor may be considered as an example of such a discrete functional component that will require unique considerations. In the packaging the discrete capacitor component elements are typically mounted on first level carriers to achieve optimum electrical performance. One parameter, line length, is becoming of increasing importance and frequently limits where the component can be located. The capacitor is usually made up as a functional item and includes custom wiring and interconnect technology to the raw capacitor body and also includes external connecting features that provide compatibility with the substrate carrier wiring. The capacitors serve many purposes including as local energy sources and noise reduction elements, they are generally positioned in an array on the substrate carrier near the integrated circuit components for electrical line length and impedance considerations.

The capacitor component elements however have some limitations in being used. They connect through fewer solder joints to the substrate wiring primarily because the physical size of the decoupling capacitor circuit component is typically smaller than the integrated circuit component. Capacitor components require a disproportionally higher temperature for reliable solder joining. Handling in manufacture often results in broken interconnections to the point where the capacitor components are actually being knocked off the substrate.

Having more than one type of integrated circuit imposes balancing considerations in processing. The principal types of integrated circuits are the standard flip chip type passivated silicon and the plastic encapsulated type. The plastic encapsulated integrated circuit element is more easily damaged by heat in fusion than the silicon device.

At the point of encapsulation it is advantageous to underfill the components for stability in service. The underfill material is easily damaged by higher temperatures.

In the invention an example fabrication approach is assembled involving more than one type of integrated circuit component element, discrete component elements and an underfill at encapsulation without interfering with each others' specifications through arranging reflow fusions in descending temperature order, a loop type repair operation is provided for a replacement for any broken or missing discrete component, a solder that joins at a lower temperature such as eutectic solder than was used earlier fusions deposited onto a new or replacement discrete component element using as an example an injection molding solder (IMS) technique. As a specific example the first attaching could be with 97% lead-3% tin solder whereas the solder for the replacement component element the IMS injected solder could be 63% tin-37% lead. The discrete component is then introduced into the fabrication operation, and with the inserted lower melting temperature solder, can then be joined into the structure with a fusion cycle of the order of the low melting temperature that will not be damaging to a component element such as a plastic encapsulated semiconductor integrated circuit. Underfill material usually added for component stability and being particularly temperature sensitive is introduced at the module encapsulation stage.

In FIG. 1 there is shown a top view of a depiction of a first level packaging arrangement of integrated circuit component elements positioned on a carrier substrate of a material such as ceramic and surrounded by discrete component elements such as capacitors.

Referring to FIG. 1, in an example first level package 1, two types of integrated circuit component elements, a passivated silicon type labelled element 2 and a plastic encapsulated type labelled element 3 are positioned on a substrate or carrier labelled element 4 of for example ceramic and connected into buried wiring that is not visible in the substrate 4 joined through fused solder pads also not visible on the underside of the integrated circuit component elements 2 and 3. The discrete component elements 5 are positioned generally around the integrated circuits 2 and 3 for minimizing line length.

There are some considerations that will be encountered in the positioning and joining into a complete module with the different types of component elements. The integrated circuit components may be of different types and sizes as and for ease of explanation consider the element 2 to be of passivated silicon and the element 3 to be encapsulated in plastic. The integrated circuit components are produced by high precision techniques such as planar processing, and the interconnections are generally very small and much more numerous than the interconnects for discrete devices. In general, however plastic encapsulated integrated circuitry is not tolerant of as high a fusion or joining temperature for the solder contact pads as the passivated silicon which can tolerate around 360 degrees C. whereas the plastic encapsulation is in the 220 degree C. or lower range. In accordance with the invention this difference is a consideration that is addressed in the procedure of the invention illustrated in connection with FIG. 4. Further, in an electrical apparatus packaging situation where there are integrated circuit components with discrete components nearby, the discrete components will have a higher profile and the number of the interconnect members will be smaller and at wider spacing than is the situation with integrated circuit components resulting in a number of instances where the interconnect members of the discrete component may be found to be damaged in visual inspection or electrical testing and the discrete component may actually break off during routine handling. This situation, in accordance with the invention, is discussed in connection FIGS. 2,3 and 4.

Figure 2:
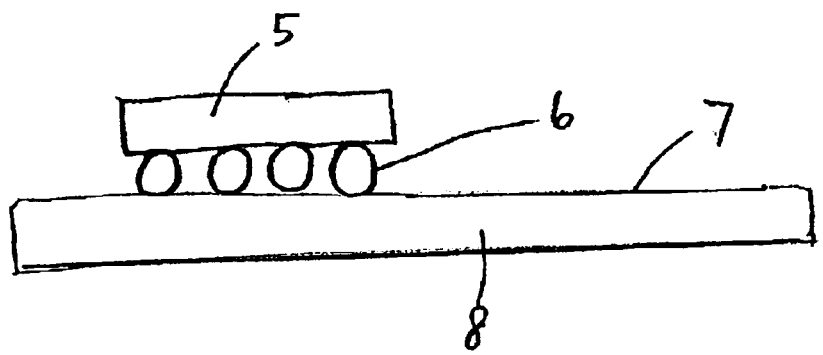
FIG. 2 is a perspective depiction of an example discrete component such as a capacitor attached through solder interconnect members to substrate wiring.

In FIG. 2 a perspective depiction is provided of an example discrete component such as a capacitor attached or joined through surface tension limited reflow solder interconnections.

Referring to FIG. 2 a depiction is provided of a discrete type component 5 such as a capacitor attached and connected to circuitry or wiring members, not shown, in the surface 7 of the substrate 8 by solder interconnections 6 of which four are shown, out of about sixteen for the entire component.

The attachment of the interconnections 6 at the surface 7 to the wiring, not shown, in the substrate 8 is achieved in a heat cycle in the presence of a flux where the metal of the interconnections 6, as the liquidus forms, through the operation of surface tension, takes a spherical interconnection shape to the surface 7 of the substrate 8. The resulting structure is somewhat vulnerable to lateral stress on the body of the component 5 as would occur in handling.

In the fabrication, at the present state of the art, the heat cycle that joins the interconnections 6 is quite high, about 360 degrees C. Such a high temperature is higher than desirable for exposure to the plastic encapsulated integrated circuit components. Reliable connections are achieved by joining the discrete components first and then joining the plastic encapsulated integrated circuit components. The joining heat cycle is then followed by a flux residue cleaning.

In an electrical apparatus packaging situation where there are integrated circuit components with discrete components nearby, the discrete components will have a higher profile and the number of the interconnect members on each will be smaller and at wider spacing than is the situation with integrated circuit components resulting in a number of instances where the interconnect members 6 of the discrete component may be found to be damaged in visual inspection or electrical testing and the discrete component may even actually break off during routine handling.

When such indication of breakage occurs, in accordance with this invention a repair and joining of the replacement discrete element must take place at a temperature that is compatible with any now present plastic encapsulated integrated circuit component.

An illustrative example of the compatible joining of a replacement component is provided in which a discrete component element that was initially attached with high temperature solder is found to have a broken solder contact and a replacement discrete component element is to be attached using solder that will fuse at a temperature that will not damage a plastic encapsulated integrated circuit that has been positioned in the overall fabrication before the existence of the broken solder contact was uncovered. The illustration is provided in connection with FIG. 3 which is a perspective depiction of the use of the injection molding solder technology (IMS) in preparing a discrete component element to serve as a replacement in which in FIG. 3A there is a side depiction of the injection apparatus used in measuring out the exact needed quantity of solder by filling interconnet shaped voids in a mold sheet and in FIG. 3B there is a cross sectional side depiction of the joining of the filled voids to pads on the discrete component element.

Referring to FIG. 3A there is shown in a cross sectional depiction of the apparatus fundamentals for the IMS technology, in which a mold sheet 10 of a non solder wettable material such as glass or plastic with thickness and strength sufficient to permit filling of measured volume cavities 11 with a liquid metal, which in accordance with the invention has a lower melting temperature than the joining temperature used earlier in the module building procedure. The use of a eutectic type solder will satisfy this criterion. The apparatus has a member 12 with an orifice 13 through which the liquid metal 14 is injected into the cavities from a reservoir 15 under pressure 16. The orifice 13 is moved serially in the direction of the arrow 17 over each cavity. The IMS injection technique utilizes a pressure differential produced through a low vacuum shown as element 18 which operates to continually evacuate air from each cavity 11 as liquid metal 14 is injected through the orifice 13.

Referring to FIG. 3B the mold sheet 10 with the filled cavities is brought into contact with a pattern of pads 6A on a replacement discrete component element 5A under pressure depicted as opposed joining forces 19, 20, in the presence of a fusion reflow temperature cycle. The cavities 11 have a taper for ease of solder release so that the solder is transferred as a pattern of contacts 6 on the discrete component element 5. After the mold sheet 10 is removed the shaped contact pattern 6A is left on the discrete component element 5. The discrete component element 5 will undergo another furnace reflow operation to let surface tension bring the pads toward balls for easier joining to the module being constructed.

At a point in any fabrication procedure of module building where components as dissimilar as a plastic encapsulated integrated circuit component element and a high fusion temperature solder alloy discrete component element are being joined; and where the discrete component element is found to have an indication of a fracture in a contact or to have been actually broken off the module structure; and the structure being fully tested at that point, the most effective solution is to replace the defective high melting temperature joining solder discrete component element with a replacement low fusion temperature eutectic type solder discrete component element. There are two facets to the problem. The first is that the joining temperature cannot be as high as it was when the discrete component element was first joined because the plastic encapsulated integrated circuit element, which is the most thermally sensitive, is now present. The second facet of the problem is that the silicon and plastic encapsulated integrated circuit component elements are underfilled with dielectric material such as epoxy. Such underfill material will be degraded with the originally used high temperature joining used in the procedure.

A major advantage of this invention is that it permits continuing the module building using lower fusion temperature solder such as by depositing the fusion solder by the injection technique of lower melting temperature solder. Otherwise the modular structure built up to this point usually must be discarded, which means throwing away an expensive item.

The solution, in accordance with the invention, for the two facets of the problem, is the deposition of low melting temperature (eutectic principle) solder onto the connecting pads of the discrete component element. The lower melting temperature solder may be applied using injection mold solder IMS technology. The lower melting temperature of an eutectic can be selected through the alloy ingredients, to be at a value low enough that it won't damage the plastic encapsulated integrated circuit component element or the underfill material.

At the present state of the art the melting of typical high lead tin solder on the discrete component element would be about 360 degrees C., but with the eutectic alloy of this invention would be low enough for a good joint to be formed at a temperature that will not damage the plastic encapsulated integrated circuit element which should be at about 220 degrees C.

In the invention the steps in the module building process of the invention involve joining, cleaning and testing for each element, arranged in decreasing fusion temperature order, and for insertion of replacement components and for insertion at encapsulation at lower and lowest respectively temperature.

In FIG. 4 there are shown flow diagram segments of the steps that would be involved in handling each of the situations in building a module in accordance with the invention wherein: in the segment labelled FIG. 4A the overall procedural steps are practiced as they would be for joining at the higher tolerable fusion temperatures; in the segment labelled FIG. 4B the procedural steps involve an inspection operation to identify a damaged connection and a loop for an insertion of a replacement component element and in the segment labelled FIG. 4C the procedural steps are illustrated for processing at the encapsulation stage of a structural increment at the lowest temperature.

Referring to FIG. 4A in an example overall procedure 21, beginning on a substrate such as 4 in FIG. 1 with the high temperature solder fusion attached discrete component elements 5 positioned around an area in which a silicon integrated circuit component element 2 and a plastic encapsulated integrated circuit component element 3 are to be positioned; the silicon integrated circuit component element 2 and the discrete component elements 5 are joined at station 22 with a thermal cycle in height and duration sufficient to fuse the solder at all the contacts of the example silicon integrated circuit component 2 of FIG. 1. For this example a solder such as 97% lead and 3% tin at a reflow temperature of about 360 degrees C. is satisfactory to join all contact pads.

The assembly constructed thus far is then flux cleaned using a typical flux removal spray at a cleaning type station 23 and thereafter tested to identify any existence of a malfunction, such as by mechanically and/or electrically testing, at a testing type station 24. As each additional element is assembled into the overall module under construction, the overall procedure repeats a joining step followed by a flux clean with a testing step of the overall module with the additional component.

In accordance with the invention a situation may arise where a component element may be desired to be added, or have to be replaced, under conditions where the standard joining operation may be too stressful, under such conditions the component element is joined under acceptable conditions, with flux cleaning followed by testing and then inserted into the overall procedure.

Considering as a first illustration a situation where the standard joining operation of the overall procedure may be too stressful such as where a much lower joining temperature would be needed, as may occur where a plastic encapsulated integrated circuit was to be attached or where a discrete component element becomes loosened in handling or is actually missing.

In accordance with the invention, this situation is illustrated in connection with the segment labelled 4B of joining stage 25, flux cleaning stage 26 and testing stage 27, in which an inspection stage 28 is provided positioned between the flux cleaning 26 and testing 27 stages in which a damaged component is detected; and in a repair or replacement loop 29, low temperature solder is applied at the damage location, as through the IMS technique illustrated in connection with FIG. 3 in a stage labelled 30, a low temperature joining then takes place at a stage labelled 31 followed by flux cleaning at a stage labelled 32 and return to the inspection stage 28 via path 33. The inspection stage 28 also passes components with no detected damage to the testing stage 27. via path 34. Replaced components that have damage that are detected in stage 27 are returned to the repair or replacement loop 29 via path 35.

Considering as another illustration a situation where it is desired that a joining operation requiring a low temperature would be combined with the overall encapsulation of the structure being built.

In accordance with the invention, this situation is illustrated in connection with the segment of the overall process of FIG. 4, labelled 4C in which there is an encapsulation stage 36, in which an underfill of a material such as epoxy is inserted into any space between the underside of a component such as 5 and the surface 7 in FIG. 2 so that it will surround the contacts 6 and reduce physical movement stresses. The insertion operation could produce some damage, and to uncover any such damage and to provide correction capability a flux cleaning stage 37 and testing stage 38 are arranged, with which an inspection stage 39 is provided positioned between the flux cleaning 37 and testing 38 stages in which damage is detected; and a repair or replacement loop 40 with low temperature solder is applied to the damage location, as through the IMS technique illustrated in connection with FIG. 3 in a stage labelled 41, a low temperature joining then takes place at a stage labelled 42 followed by flux cleaning at a stage labelled 43 and return to the inspection stage 39 via path 44.

The inspection stage 39 also passes components with no detected damage to the testing stage 38 via path 45. Under a condition where the flux cleaning of stage 37 is not needed the output of stage 36 can be direct to stage 39. Replaced components that have damage that are detected in stage 38 are returned to the repair or replacement loop 40 via path 46.

What has been described is a procedure for accommodating differences in structure and tolerances in packaging of different size and performance components in electrical apparatus.

What is claimed is:

1. In the fabrication of modular, interconnected components, electrical apparatus,
    wherein said interconnected components include integrated circuit and discrete types, and,
    wherein each component element is built into a reflow soldered joined connections, type modular structure, positioned on a substrate,
assembly apparatus comprising in combination:
    means for providing a selectable fusion temperature excursion to said modular structure
        having a magnitude and duration sufficient to produce said reflow solder connection,
    means for grouping, and positioning on said substrate, a first portion of said components,
        said first portion being according to the highest tolerable said selectable fusion temperature excursion,
    means for joining said reflow soldered connections of said first portion of said components by applying said fusion temperature excursion to said modular structure positioned on said substrate,
    means for flux cleaning said reflow soldered connections of said first portion of said components,
    means for testing said reflow soldered connections of said first portion of said components,
    means for grouping, and positioning on said substrate, at least one intermediate portion of said components, each said intermediate portion being according to the next to highest tolerable said selectable fusion temperature excursion,
    means for joining said reflow soldered connections of said intermediate portion of said components by applying said next to highest fusion temperature excursion to said modular structure positioned on said substrate,
    means for serially flux cleaning and testing in separated tandem stages said reflow soldered connections of each said intermediate portion of said components,
    means positioned between said flux cleaning and testing stages an inspection and replacement capability stage adapted to detect component connection breakage or absence,
        said inspection and replacement capability stage including a replacement loop having a capability:
            to apply low fusion temperature solder to a replacement component,
            to join said replacement component into said modular structure in the presence of said next to highest fusion temperature excursion, resulting in a reflow joint connection,
            to flux clean all resulting reflow joint connections followed by return to said inspection and replacement capability stage, and,
            return to said testing stage; and,
    means for introducing underfill material into said modular structure positioned on said substrate in an encapsulation stage for said modular structure said introducing means including means adapted to force said underfill material into any space between said substrate and said component and surrounding all contact pads of said component, in the presence of the lowest fusion temperature excursion,
    means following said underfill introduction for any damage correction,
        said means comprising an inspection and replacement stage and capability so adapted to apply low fusion temperature solder to a replacement component,
            to join said replacement component into said modular structure in the presence of said next to lowest fusion temperature excursion,
                resulting in an underfill reflow joint connection,
            to return to said underfill inspection and replacement capability stage, and,
            to return to said underfill testing stage.

2. The assembly apparatus of claim 1 wherein said interconnected components include passivated integrated circuit type components and plastic encapsulated integrated circuit type components.

3. The assembly apparatus of claim 1 wherein said discrete type components are capacitors.

4. The assembly apparatus of claim 1 wherein in said replacement loop said low fusion temperature solder is a material selected from the group of eutectic solder, an alloy of 63% tin and 37% lead solder, and lead free solder.

5. The assembly apparatus of claim 4 wherein in said replacement loop said low fusion temperature solder is applied through the injection mold solder type process.

6. The assembly apparatus of claim 5 wherein in said damage correction, a flux cleaning stage is positioned immediately following said underfill introduction.

7. A process for fabrication of a modular, interconnected component, electrical apparatus) wherein each component clement is built into a soldered connection modular structure on a substrate, through the technique of solder reflow in the presence of a fusion temperature excursion, the steps of:

arranging the component interconnecting procedure into a series of joining step, flux removal step and testing step, increments that add a component, each joining step occurring in the presence of a fusion temperature excursion, and each testing step verifying the fusion event of said component being added, joining all of the higher heat tolerant, to be added, components in the presence of the highest fusion temperature excursion, joining all of the lesser heat tolerant, to be added, components in the presence of an intermediate fusion temperature excursion, providing in the intermediate temperature joining operation, between the flux cleaning step and the testing step, an inspection and reinsertion stage and capability operable to detect breakage or absence and in a replacement loop to apply low fusion temperature solder to a replacement component, join that replacement component in the presence of an intermediate temperature fusion excursion, flux clean and return to said inspection stage and return to said testing step, and, joining, in an encapsulation stage, in the presence of the lowest fusion temperature excursion, an underfill material introduced into any space between said substrate and the underside of any component, said introduced underfill material surrounding all contact pads of said component, providing, in that lowest fusion temperature joining operation, a testing step, an inspection and reinsertion stage and capability operable to detect breakage or absence and in a replacement loop to apply low temperature solder to a replacement component, join that replacement component in the presence of said lowest temperature fusion excursion, flux clean and return to said inspection stage and return to said testing step.

8. The process of claim 7 wherein said interconnected components include integrated circuit type components and discrete type components.

9. The process of claim 8 wherein said discrete type components are capacitors.

10. The process of claim 9 wherein in said replacement loop said low fusion temperature solder is a material selected from the group of eutectic solder, an alloy of 63% tin and 37% lead solder, and lead free solder.

11. The process of claim 10 wherein in said replacement loop said low fusion temperature solder is applied through the injection mold solder type process.

* * * * *